(12) United States Patent
Fujimoto et al.

(10) Patent No.: US 7,711,023 B2
(45) Date of Patent: May 4, 2010

(54) SEMICONDUCTOR LASER DEVICE AND FABRICATION METHOD THEREFOR

(75) Inventors: Yasuhiro Fujimoto, Okayama (JP); Toru Takayama, Nara (JP); Satoshi Murasawa, Hyogo (JP); Hisashi Nakayama, Aichi (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/727,229

(22) Filed: Mar. 26, 2007

(65) Prior Publication Data

US 2007/0223550 A1 Sep. 27, 2007

(30) Foreign Application Priority Data

Mar. 27, 2006 (JP) .............................. 2006-084718

(51) Int. Cl.
*H01S 5/00* (2006.01)
(52) U.S. Cl. .................................. 372/45.01
(58) Field of Classification Search .............. 372/43–46
See application file for complete search history.

(56) References Cited

U.S. PATENT DOCUMENTS 5,544,185 A * 8/1996 Kadoiwa et al. ......... 372/44.01
6,487,226 B1 * 11/2002 Iwamoto et al. .......... 372/46.01
2004/0047379 A1 * 3/2004 Kitamura ..................... 372/45

FOREIGN PATENT DOCUMENTS

| JP | 01-202880 | 8/1989 |
|---|---|---|
| JP | 01-286487 | 11/1989 |
| JP | 05-160504 | 6/1993 |
| JP | 09-036477 | 2/1997 |
| JP | 09-298335 | 11/1997 |
| JP | 11-87831 A | 3/1999 |
| JP | 2000-315837 | 11/2000 |
| JP | 2003-179302 | 6/2003 |
| JP | 2005-277026 | 10/2005 |
| JP | 2005-327907 | 11/2005 |

\* cited by examiner

*Primary Examiner*—Minsun Harvey
*Assistant Examiner*—Patrick Stafford
(74) *Attorney, Agent, or Firm*—McDermott Will & Emery LLP

(57) ABSTRACT

A semiconductor laser device has a multilayer structure including a first clad layer, an active layer, and a second clad layer stacked successively on a semiconductor substrate in order of increasing distance from the semiconductor substrate. At least one of the first clad layer and the second clad layer has a compressive distortion with respect to the semiconductor substrate. At least one of the first clad layer and the second clad layer includes a semiconductor layer having a tensile distortion with respect to the semiconductor substrate.

1 Claim, 4 Drawing Sheets

| Etching Stop Layer With Negative Lattice Mismatch | Present | Present | Absent | Absent |
|---|---|---|---|---|
| Semiconductor Layer With Negative Lattice Mismatch Other Than Etching Stop Layer | Absent | Present | Present | Absent |
| Clad Layer With Positive Lattice Mismatch | Present | Present | Present | Present |
| Reliability (MTTF is Not Less Than 5000 Hours) | Yes | Yes | Yes | No |

SEMICONDUCTOR LASER DEVICE AND FABRICATION METHOD THEREFOR

BACKGROUND OF THE INVENTION

The present invention relates to a semiconductor laser device and a fabrication method therefor, and, more particularly, to a semiconductor laser device which can be used preferably as a light source for an optical disk apparatus or the like and a fabrication method therefor.

In a semiconductor laser device, particularly in an AlGaInP semiconductor laser device in which the heterojunction between an active layer and a clad layer cannot have a sufficiently high barrier, a technology for controlling impurity doping has an important influence on the characteristics of the device.

Specifically, there has been conventionally known an AlGaInP semiconductor laser device wherein the clad layer adjacent to the active layer is left undoped by controlling the position at which impurity doping is performed during the fabrication thereof. The conventional AlGaInP semiconductor laser having such a structure is advantageous in that the diffusion of the impurity from the clad layer into the active layer can be prevented.

However, the conventional AlGaInP semiconductor laser device described above has the problem that, when the position at which impurity is performed is further away from the active layer, the efficiency of conversion from an injected current to light deteriorates so that the operating current thereof increases. Conversely, when the position at which impurity doping is performed is closer to the active layer, the problem occurs that the diffusion of the impurity reaches the interior of the active layer due to a thermal process or the like and the deterioration of the device occurs within a short time of about several hours to reduce the lifetime of the device and consequently degrade the reliability of the device.

Thus, in the conventional AlGaInP semiconductor laser, it has been necessary to control impurity doping with high accuracy so that considerable difficulty has been encountered in the fabrication thereof.

To reduce the difficulty, Japanese Laid-Open Patent Publication No. HEI 11-87831 proposes a semiconductor laser device having a structure which can not only prevent the diffusion of an impurity into the active layer but also improve light emission efficiency, reduce the operating current, and suppress the reliability degradation of the device by controlling the lattice mismatch of the clad layer with respect to a semiconductor substrate.

However, the semiconductor laser device having the structure which controls the lattice mismatch of the clad layer with respect to the semiconductor substrate described above has had the problem that a crystal defect occurs in the active layer and the long term reliability of the device cannot be guaranteed, though the impurity diffusion into the active layer can be prevented. In addition, the semiconductor laser device also has had the problem that the setting of process conditions in forming a ridge waveguide is difficult and the production yield thereof is low.

SUMMARY OF THE INVENTION

In view of the foregoing, it is therefore an object of the present invention to provide a semiconductor laser device having a structure which allows an improvement in the reliability of the device and a fabrication method therefor. Another object of the present invention is to provide a laser device having a structure which allows easy formation of a ridge waveguide and a fabrication method for a laser device in which a ridge waveguide can be easily formed.

As a result of conducting intensive studies, the present inventors have found that, when a clad layer has a unidirectional distortion, which is either a compressive distortion or a tensile distortion, with respect to a semiconductor substrate, a crystal defect occurs in an active layer and degrades the reliability of a device. The present invention has been achieved in view of the foregoing findings and provides a semiconductor laser device comprising a clad layer having both of the compressive distortion and the tensile distortion.

Specifically, a semiconductor laser device according to a first aspect of the present invention is a semiconductor laser device having a multilayer structure comprising a first clad layer, an active layer, and a second clad layer stacked successively on a semiconductor substrate in order of increasing distance from the semiconductor substrate, wherein at least one of the first clad layer and the second clad layer has a compressive distortion with respect to the semiconductor substrate and at least one of the first clad layer and the second clad layer includes a semiconductor layer having a tensile distortion with respect to the semiconductor substrate.

In the semiconductor laser device according to the first aspect of the present invention, at least one of the first and second clad layers has the compressive distortion with respect to the semiconductor substrate so that the lattice spacing of a crystal is reduced. As a result, it is possible to effectively prevent the diffusion of an impurity into the active layer. In addition, at least one of the first and second clad layers having the compressive distortion includes therein the semiconductor layer having the tensile distortion with respect to the semiconductor substrate so that the compressive distortion and the tensile distortion each with respect to the semiconductor substrate cancel out each other. This suppresses the occurrence of a crystal defect in the active layer and improves the reliability of the semiconductor laser device.

The compressive distortion with respect to the semiconductor substrate indicates herein that the magnitude $\Delta a/a$ of the lattice mismatch of the semiconductor layer with respect to the semiconductor substrate is positive. The tensile distortion with respect to the semiconductor substrate indicates herein that the magnitude $\Delta a/a$ of the lattice mismatch of the semiconductor layer with respect to the semiconductor substrate is negative. The magnitude $\Delta a/a$ of the lattice mismatch of the semiconductor layer with respect to the semiconductor substrate is given by $\Delta a/a=(a2-a1)/a1$ wherein a1 represents the lattice constant of the semiconductor substrate and a2 represents the lattice constant of the semiconductor layer.

Preferably, in the semiconductor laser device according to the first aspect of the present invention, at least one of the first clad layer and the second clad layer having the compressive distortion has a lattice mismatch of not less than $2.0 \times 10^{-4}$ and not more than $3.0 \times 10^{-3}$ with respect to the semiconductor substrate and the semiconductor layer having the tensile distortion has a lattice mismatch of not less than $-2.0 \times 10^{-3}$ and not more than $-2.0 \times 10^{-4}$ with respect to the semiconductor substrate. According to the preferred embodiment, the diffusion of an impurity into the active layer can be reliably prevented.

Preferably, in the semiconductor laser device according to the first aspect of the present invention, the second clad layer has the semiconductor layer having the tensile distortion and the semiconductor layer having the tensile distortion functions as an etching stop layer when a ridge portion is formed in the second clad layer by etching.

According to the preferred embodiment, it becomes possible to easily form the ridge portion in the second clad layer by using the semiconductor layer functioning as the etching stop layer. As a result, the production yield of the device of which the long term reliability is guaranteed is improved.

A semiconductor laser device according to a second aspect of the present invention is a semiconductor laser device having a multilayer structure comprising a first clad layer, an active layer, and a second clad layer stacked successively on a semiconductor substrate in order of increasing distance from the semiconductor substrate, wherein at least one of the first clad layer and the second clad layer has a compressive distortion with respect to the semiconductor substrate and at least one of the first clad layer and the second clad layer has a heavily doped impurity region containing an impurity at a relatively high concentration and a lightly doped impurity region containing an impurity at a relatively low concentration.

In the semiconductor laser device according to the second aspect of the present invention, at least one of the first and second clad layers has the compressive distortion with respect to the semiconductor substrate so that the lattice spacing of a crystal is reduced. As a result, it is possible to effectively prevent the diffusion of an impurity into the active layer. In addition, at least one of the first and second clad layers has an impurity concentration difference therein so that the occurrence of a crystal defect in the active layer is suppressed and the reliability of the semiconductor laser device is improved.

Preferably, in the semiconductor laser device according to the second aspect of the present invention, the heavily doped impurity region is formed at a position further away from the active layer than a position at which the lightly doped impurity region is formed and the lightly doped impurity region is formed at a position closer to the active layer than at the position at which the heavily doped impurity region is formed. According to the preferred embodiment, the diffusion of an impurity into the active layer can be reliably prevented.

Preferably, in the semiconductor laser device according to the second aspect of the present invention, at least one of the first clad layer and the second clad layer includes a semiconductor layer having a tensile distortion with respect to the semiconductor substrate. According to the preferred embodiment, the diffusion of an impurity into the active layer can be reliably prevented.

Preferably, in the semiconductor laser device according to the second aspect of the present invention, at least one of the first clad layer and the second clad layer having the compressive distortion has a lattice mismatch of not less than $2.0 \times 10^{-4}$ and not more than $3.0 \times 10^{-3}$ with respect to the semiconductor substrate. According to the preferred embodiment, the diffusion of an impurity into the active layer can be reliably prevented.

Preferably, in the semiconductor laser device according to the second aspect of the present invention, the semiconductor layer having the tensile distortion has a lattice mismatch of not less than $-2.0 \times 10^{-3}$ and not more than $-2.0 \times 10^{-4}$ with respect to the semiconductor substrate. According to the preferred embodiment, the diffusion of an impurity into the active layer can be reliably prevented.

Preferably, in the semiconductor laser device according to the second aspect of the present invention, a well layer composing the active layer has the compressive distortion with respect to the semiconductor substrate and a film thickness of not less than 20 nm. The preferred embodiment is effective in improving the reliability of the device.

Even when the semiconductor laser device according to the second aspect of the present invention has a self-sustained pulsation characteristic which increases the operating current in high temperature condition, the reliability of the device is improved.

A method for fabricating a semiconductor laser device according to an aspect of the present invention comprises the steps of: forming, on a semiconductor substrate, a first clad layer having a lattice mismatch of not less than $2.0 \times 10^{-4}$ and not more than $3.0 \times 10^{-3}$ with respect to the semiconductor substrate; forming an active layer on the first clad layer; forming, on the active layer, a second clad layer having a lattice mismatch of not less than $2.0 \times 10^{-4}$ and not more than $3.0 \times 10^{-3}$ with respect to the semiconductor substrate and including therein a semiconductor layer having a lattice mismatch of not less than $-2.0 \times 10^{-3}$ and not more than $-2.0 \times 10^{-4}$ with respect to the semiconductor substrate; and etching the second clad layer using the semiconductor layer as an etching stop layer to form a ridge portion therein.

In accordance with the method for fabricating a semiconductor laser device according to the aspect of the present invention, it is possible to suppress the occurrence of a crystal defect in the active layer, easily fabricate the device of which the long term reliability is guaranteed, and improve the production yield thereof by using the etching stop layer.

According to the present invention, a semiconductor laser device having a structure with excellent reliability and a fabrication therefor can be provided.

DETAILED DESCRIPTION OF THE INVENTION

Figure 1:
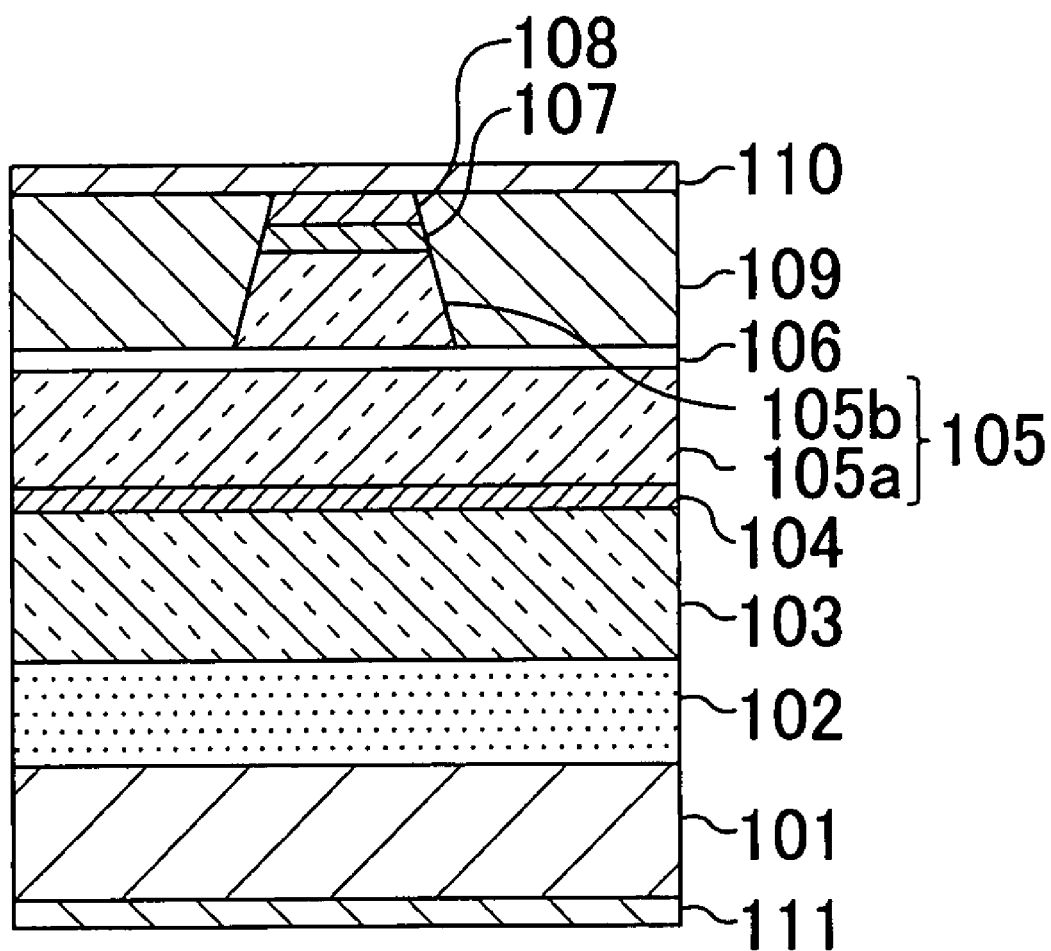
FIG. 1 is a cross-sectional view showing a structure of a semiconductor laser device according to a first embodiment of the present invention.

Referring now to the drawings, the individual embodiments of the present invention will be described herein below.

EMBODIMENT 1

FIG. 1 is a cross-sectional view of a semiconductor laser device according to the first embodiment of the present invention.

As shown in FIG. 1, a buffer layer 102 made of n-type GaAs having a thickness of 500 nm, a lower clad layer 103 made of n-type AlGaInP having a thickness of 1200 nm, an active layer 104 having a quantum well structure made of GaInP, a first upper clad layer 105a made of p-type AlGaInP having a thickness of 400 nm, an etching stop layer 106 made of p-type GaInP having a thickness of 6 nm, a second upper clad layer 105b made of p-type AlGaInP having a thickness of 600 nm, an intermediate layer 107 made of p-type GaInP having a thickness of 50 nm, and a contact layer 108 made of p-type GaAs having a thickness of 200 nm are formed successively in an ascending order on a substrate 101 made of n-type GaAs. The second upper clad layer 105b, the intermediate layer 107, and the contact layer 108 constitute a striped ridge waveguide. A current block layer 109 made of n-type GaAs having a thickness of 400 nm is further formed over the side surfaces of the striped ridge waveguide and the upper surface of the etching stop layer 106. A p-type electrode 110 is formed over the contact layer 108 and the current block layer 109, while an n-type electrode 111 is formed on the back surface of the substrate 101.

A description will be given herein below to a specific method for fabricating the semiconductor layer according to the first embodiment thus constructed.

Figure 2A:
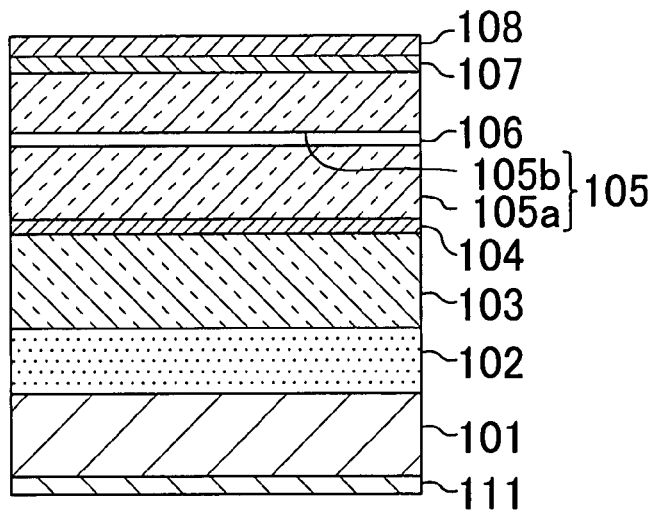
FIGS. 2A to 2C are cross-sectional views illustrating a method for fabricating the semiconductor laser device according to the first embodiment in the order in which the process steps thereof are performed.
Figure 2B:
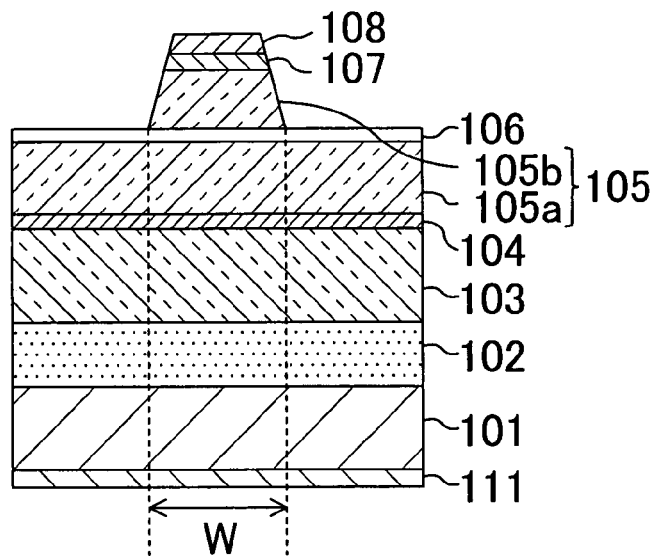
Figure 2C:
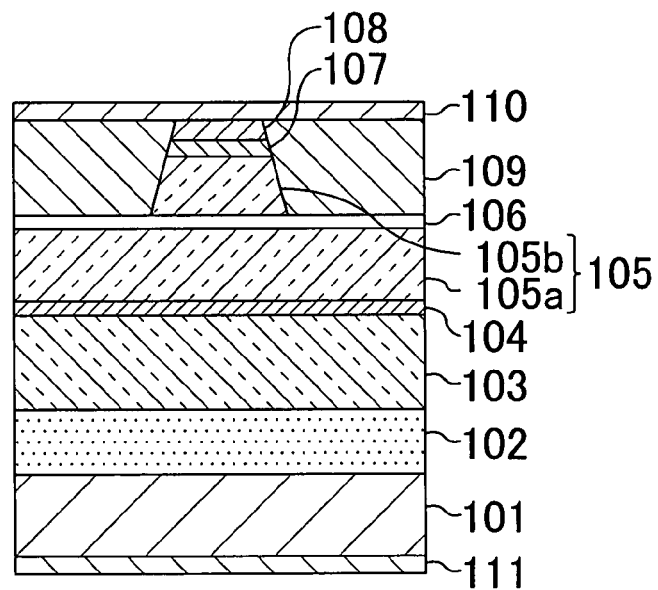

FIGS. 2A to 2C are cross-sectional views for illustrating the process steps of the method for fabricating the semiconductor laser device according to the first embodiment.

First, as shown in FIG. 2A, the buffer layer 102 made of n-type GaAs having a thickness of 500 nm, the lower clad layer 103 made of n-type AlGaInP having a thickness of 1200 nm, the active layer 104 having the quantum well structure made of GaInP, the first upper clad layer 105a made of p-type AlGaInP having a thickness of 400 nm, the etching stop layer 106 made of p-type GaInP having a thickness of 6 nm, the second upper clad layer 105b made of p-type AlGaInP having a thickness of 600 nm, the intermediate layer 107 made of p-type GaInP having a thickness of 50 nm, and the contact layer 108 made of p-type GaAs having a thickness of 200 nm are stacked successively in an ascending order on the substrate 101 made of n-type GaAs by metal organic vapor phase epitaxy.

Upper clad layers 105 composed of the first upper clad layer 105a and the second upper clad layer 105b have a lattice mismatch of not less than $2.0 \times 10^{-4}$ and not more than $3.0 \times 10^{-3}$ set with respect to the substrate 101. The etching stop layer 106 has a lattice mismatch of not less than $-2.0 \times 10^{-3}$ and not more than $-2.0 \times 10^{-4}$ set with respect to the substrate 101. The impurity concentrations of the lower clad layer 103 and the upper clad layers 105 are set to values in the range of about $3 \times 10^{17}$ cm$^{-3}$ to $1.5 \times 10^{18}$ cm$^{-3}$.

Although the conductivity type of the upper clad layers 105 having the lattice mismatch is limited to the p-type in the case described herein above, the conductivity type of the upper clad layers 105 having the lattice mismatch may also be limited to the n-type. It is also possible to adopt a structure in which not only the upper clad layers 105 but also the lower clad layer 103 has a lattice mismatch. When each of the upper clad layers 105 and the lower clad layer 103 has a lattice mismatch, even though the conductivity type is either the n-type or the p-type, the lattice mismatch may either be substantially uniform or vary within the layer.

The active layer 104 is formed by alternately stacking five well layers each made of GaInP having a thickness of 5 nm and five barrier layers each made of AlGaInP having a thickness of 5 nm.

Although the present embodiment has described the case where the active layer 104 has the quantum well structure, it is also possible to construct the active layer 104 by using a bulk. The active layer 104 may have either the n-type conductivity or the p-type conductivity or may also be undoped, though the conductivity type thereof is not particularly shown.

The etching stop layer 106 may have the n-type conductivity or may be undoped. Although the etching stop layer 106 is formed between the upper clad layers 105 (the first upper clad layer 105a and the second upper clad layer 105b) in the description given herein above, the etching stop layer 106 may also be formed within the lower clad layer 103 and at any position provided that the etching stop layer 106 is formed in the upper clad layers 105 or in the lower clad layer 103. The etching stop layer 106 is not limited to the single layer. A plurality of the etching stop layers 106 may also be provided.

Next, as shown in FIG. 2B, a striped resist mask (not shown) having a width w (e.g., 3 μm) is formed and then etching is performed by a wet or dry etching method till the etching stop layer 106 is reached, thereby forming the striped ridge waveguide. The cross-sectional view shown in FIG. 2B is taken in a direction orthogonal to the direction in which the stripe extends.

In the step illustrated in FIG. 2B, the etching stop layer 106 is formed in the upper clad layers 105 so that it is possible to strictly control etching conditions in forming the ridge waveguide by using a selective etching method. Specifically, the etching stop layer 106 has a negative lattice mismatch, as described above. That is, the proportion of Ga atoms to all the group III atoms is adjusted to be higher than that of In atoms (producing a Ga-rich state), whereby selectivity during the etching is improved. The selectivity during the etching is thus improved by the same mechanism according to which the GaAs layer having a lattice mismatch more negative than that of the AlGaAs layer is used as the etching stop layer because, of the GaAs layer and the AlGaAs layer each made of an AlGaAs material, the GaAs layer is lower in etching rate than the AlGaAs layer containing Al. Thus, in the step shown in FIG. 2B, the striped ridge waveguide is formed by performing selective etching using the etching stop layer 106 made of GaInP so that the management of the fabrication process is facilitated. This allows easy control of an equivalent refractivity difference and the achievement of a high production yield.

Next, as shown in FIG. 2C, the current block layer 109 made of n-type GaAs having a thickness of 400 nm is formed over the upper surface of the etching stop layer 106 and the respective side surfaces of the second upper clad layer 105b, the intermediate layer 107, and the contact layer 108. Subsequently, the p-type electrode 110 made of, e.g., Ti, Pt, and Au stacked in successive layers in an ascending order is formed over the contact layer 108 and the current block layer 109. On the other hand, the n-type electrode 111 made of, e.g., AuGe, Ni, and Au stacked in successive layers in an ascending order is formed on the back surface of the substrate 101. In this manner, the semiconductor laser device according to the first embodiment is formed.

Figure 3:
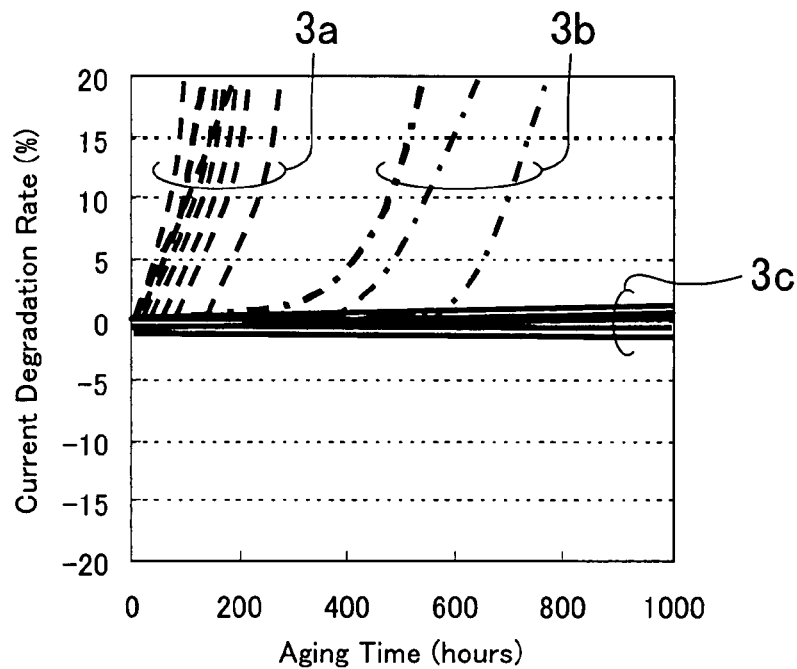
FIG. 3 is a graph showing the relationship between an aging time and a current degradation rate when an aging test is performed on the semiconductor laser device according to the first embodiment.

Referring to FIG. 3, a description will be given herein below to the effect of the lattice mismatch of the etching stop layer 106 formed in the upper clad layers 105 (between the first upper clad layer 105a and the second upper clad layer 105b).

FIG. 3 shows the relationship between an aging time (hours) and a current degradation rate (%) in each of the following cases 3a to 3c where devices were fabricated differently in lots on a case-by-case basis and an aging test was performed on the fabricated devices at a temperature of 90° C. with the application of a current of 5 mW. Depending on the cases 3a to 3c, the upper clad layers 105 of the fabricated devices have the different lattices mismatches shown below and the etching stop layers 106 thereof have or do not have the lattice mismatch shown below. In the aging test, the devices which exhibited small increases in operating current were determined to be acceptable on a per lot basis.

When a1 represents the lattice constant of the semiconductor substrate and a2 represents the lattice constant of the semiconductor layer as described above, the magnitude $\Delta a/a$ of the lattice mismatch is given by $\Delta a/a=(a2-a1)/a1$. In the case 3a, the magnitude $\Delta a/a$ of the lattice mismatch of the upper clad layers 105 with respect to the substrate 101 satisfies the relationship given by $\Delta a/a=0$. In the case 3b, the magnitude $\Delta a/a$ of the lattice mismatch of the upper clad layers 105 satisfies the relationship given by $\Delta a/a=5.0\times10^{-4}$ (i.e., the upper clad layers 105 have a lattice mismatch of $5.0\times10^{-4}$). By contrast, the case 3c corresponds to the present embodiment in which the magnitude $\Delta a/a$ of the lattice mismatch of the upper clad layers 105 satisfies the relationship given by $\Delta a/a=5.0\times10^{-4}$ (i.e., the upper clad layers 105 have a lattice mismatch of $5.0\times10^{-4}$) and the magnitude $\Delta a/a$ of the lattice mismatch of the etching stop layer 106 satisfies the relationship given by $\Delta a/a=-3.0\times10^{-4}$ (i.e., the etching stop layer 106 has a lattice mismatch of $-3.0\times10^{-4}$).

As shown in FIG. 3, in the case 3a, the operating current values increased within several tens of hours in the majority of the devices so that the passing rate of the test was approximately 0%. In the case 3b, there were some devices in which the operating current values increased within several hundreds of hours so that the passing rate of the test was about 70%. By contrast, in the case 3c corresponding to the present embodiment, the operating current values did not increase over a period of several thousands of hours or more in all the devices so that the passing rate of the test was about 100%.

The reason for such experimental results is that, because the upper clad layers 105 have the positive lattice mismatch with respect to the substrate 101, the lattice spacing of a crystal is reduced so that the diffusion of an impurity into the active layer 104 is prevented and, because the etching stop layer 106 has the negative lattice mismatch with respect to the substrate 101, which is opposite to the positive lattice mismatch of the upper clad layers 105, the distortions to the substrate 101 cancel out each other (i.e., the distortion resulting from the positive lattice mismatch and the distortion resulting from the negative lattice mismatch cancel out each other) and, therefore, the occurrence of a crystal defect is suppressed.

Figure 4:
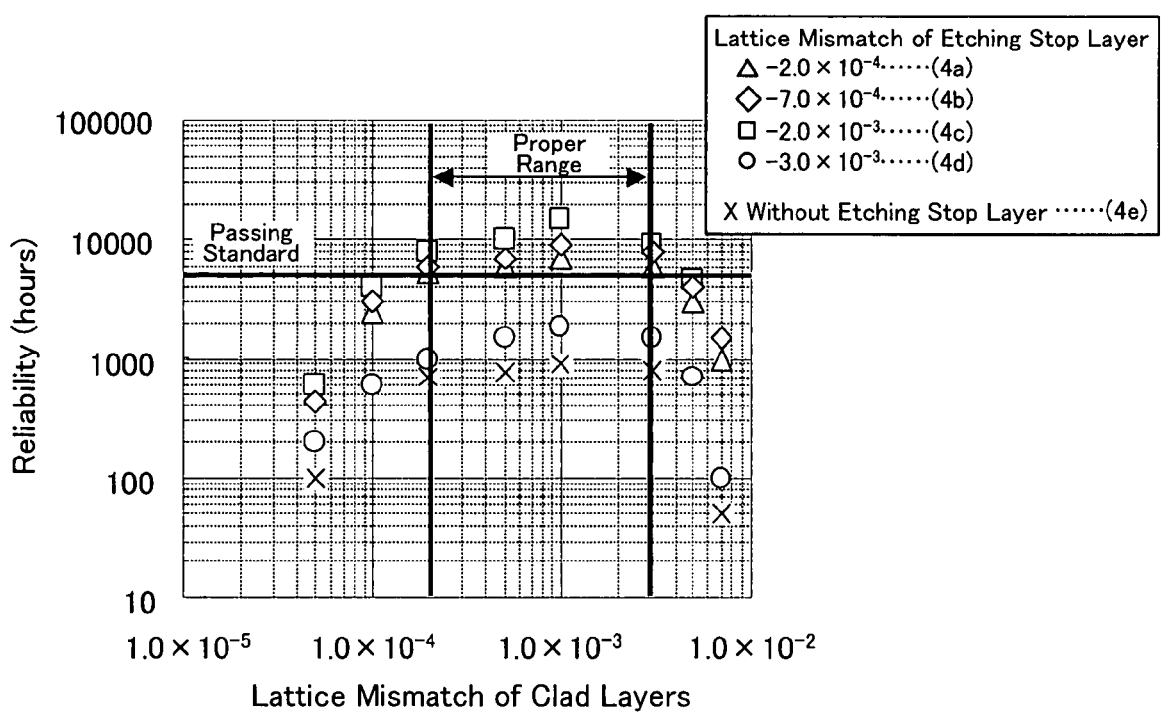
FIG. 4 is a graph showing the relationship between the lattice mismatch of clad layers and reliability in the semiconductor laser device according to the first embodiment.

FIG. 4 shows the result of reliability evaluation of each of devices fabricated by varying the lattice mismatch of the upper clad layers 105 and the lattice mismatch of the etching stop layer 104. The reliability of each of the devices was evaluated at a temperature of 90° C. with the application of a current of 5 mW.

From FIG. 4, it will be understood that, in the case (the case 4e shown in the upper part of FIG. 4) where the upper clad layers 105 have a positive lattice mismatch and the etching stop layer 106 has no lattice mismatch (or when no etching stop layer is provided), the reliability increases but, when the lattice mismatch is over or under a proper range, the diffusion of an impurity into the active layer 104 occurs to cause a crystal defect in the active layer 104 and degrade the reliability. By contrast, it will be understood that, when the upper clad layers 105 have a positive lattice mismatch and the etching stop layer 106 has a negative lattice mismatch (the cases 4a to 4d in the upper part of FIG. 4), the reliability greatly improves when each of the lattice mismatches is within a proper range.

The present inventors have examined the proper ranges of the respective lattice mismatches of the upper clad layers 105 and the etching stop layer 106 by assuming that the average lifetime of the devices is represented by MTTF and a period of 5000 hours or more is a passing standard and found that the proper range of the lattice mismatch of the upper clad layers 105 is not less than $2.0\times10^{-4}$ and not more than $3.0\times10^{-3}$ and the proper range of the lattice mismatch of the etching stop layer 106 is not less than $-2.0\times10^{-3}$ and not more than $-2.0\times10^{-4}$.

A description will be given herein below to the impurity concentration of the upper clad layers 105.

In the present embodiment, the impurity concentration of the upper clad layers 105 is preferably not less than $3\times10^{17}$ cm$^{-3}$.

By thus adjusting the impurity concentration of the upper clad layers 105, it is possible to suppress the occurrence of a crystal defect in the active layer 104 and maintain an excellent temperature characteristic even in high-temperature condition at a temperature of not less than 90° C. As a result, the long term reliability can be guaranteed.

So far, the present inventors have implemented an excellent temperature characteristic and excellent reliability in condition under a temperature of less than 75° C. However, when consideration is given to an application of an AlGaInP semiconductor laser device in higher-temperature condition (at a temperature of not less than 85° C.), such as an on-vehicle application, it is necessary to further improve the temperature characteristic. Although it has been found that the temperature characteristic can be improved by setting the impurity concentration to a value of not less than $3\times10^{17}$ cm$^{-3}$, reliability has had a problem because, at the stage at which only the upper clad layers 105 are allowed to have the lattice mismatch, a crystal defect occurs in the active layer 104 as shown in the foregoing cases 3b and 4e of FIGS. 3 and 4. To solve the problem, the present inventors have formed the etching stop layer 106 having the negative lattice mismatch in the upper clad layers 105, as described above, and thereby suppressed the occurrence of a crystal defect in the active layer. In addition, the present inventors have found that, by setting the impurity concentration of the upper clad layers 105 to a value of not less than $3\times10^{17}$ cm$^{-3}$, it is possible to guarantee the long term reliability, while maintaining an excellent temperature characteristic, even in high-temperature condition at a temperature of not less than 90° C.

By thus fabricating the device such that the upper clad layers 105 have a lattice mismatch of not less than $2.0\times10^{-4}$ and not more than $3.0\times10^{-3}$ with respect to the semiconductor substrate 101 and the etching stop layer 106 has a lattice mismatch of not less than $-2.0\times10^{-3}$ and not more than $-2.0\times10^{-4}$ with respect to the semiconductor substrate 101, it is possible to suppress the occurrence of a crystal defect in the active layer 104 by preventing the diffusion of an impurity into the lower clad layer 103 and into the upper clad layers 105 and also maintain an excellent temperature characteristic even in high-temperature condition at a temperature of not less than 90° C. Accordingly, the reliability of the device can be improved.

As a result, the semiconductor laser device according to the present embodiment allows easy control of impurity doping during the fabrication thereof and, even when impurity doping is performed at a position extremely close to the active layer 104, the diffusion of the implanted impurity into the active layer 104 can be effectively prevented. This makes it possible to achieve a reduction in operating current by improving the light emission efficiency of the semiconductor laser device and improve the reliability of the device.

Figures 5, 6:
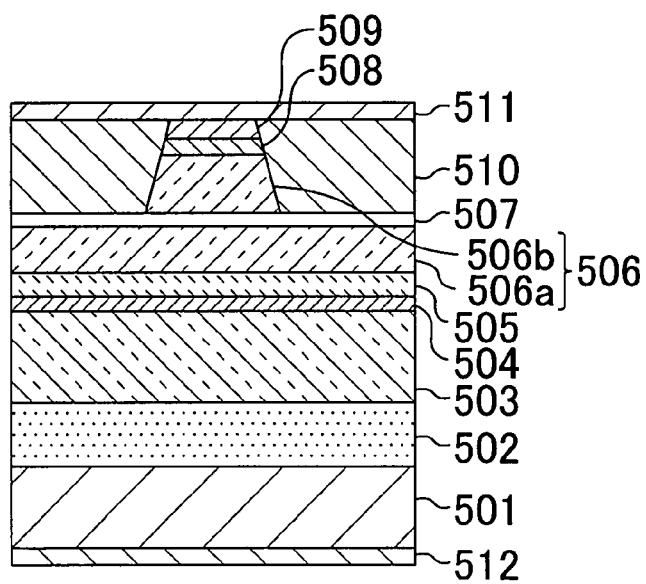
FIG. 5 is a list of the results of an experiment performed under combined conditions for the reliability evaluation of semiconductor laser devices having different structures in the first embodiment.
FIG. 6 is a cross-sectional view showing a structure of a semiconductor laser device according to a second embodiment of the present invention.

Although the semiconductor layer having the negative lattice mismatch is only the etching stop layer 106 in the case described herein above, the same effects as described above are obtainable even when a semiconductor layer other than the etching stop layer 106 has a negative lattice mismatch. FIG. 5 shows the results of an experiment performed under combined conditions for the reliability evaluation of semiconductor laser devices fabricated to have clad layers with a positive lattice mismatch, wherein the average lifetime of the devices is represented by MTTF and a period of 5000 hours or more is a passing standard. In some of the fabricated devices, the etching stop layers 106 had a negative lattice mismatch. In the others, semiconductor layers other than the etching stoppers 106 had a negative lattice mismatch. As is obvious from FIG. 5, the reliability of each of the devices improved beyond the passing standard when at least one semiconductor layer having a negative lattice mismatch was included in the clad layers having a positive lattice mismatch. Although the same reliability experiment was performed on the device in which the etching stop layer having a positive lattice mismatch was formed within the clad layer having a positive lattice mismatch, it was proved that the reliability of the device did not improve. Therefore, it is evident that the formation of the semiconductor layer having a negative lattice mismatch in the clad layer having a positive lattice mismatch is preferable.

VARIATION OF EMBODIMENT 1

A semiconductor laser device according to a variation of the first embodiment is different from the semiconductor laser device according to the first embodiment described above only in the structure of the active layer 104 and is the same in the other respects.

Specifically, the semiconductor laser device according to the present variation is the same as in the first embodiment in that the active layer 104 is formed by alternately stacking the five well layers each made of GaInP having a thickness of 5 nm and the five barrier layers made of AlGaInP having a thickness of 5 nm. The semiconductor laser device according to present the variation is characterized in that the active layer 104 has a self-sustained pulsation characteristic, the well layers made of GaInP composing the active layer 104 have a positive lattice mismatch of not less than $3.0 \times 10^{-4}$ and not more than $5.0 \times 10^{-3}$, and the barrier layer made of AlGaInP is lattice-matched to the substrate 101.

In the semiconductor laser device according to the present variation, the total number of the well layers made of GaInP is large and therefore, even in the semiconductor laser device having the self-sustained pulsation characteristic which increases the operating current in high-temperature condition, the same effects as obtained in the first embodiment are obtainable. In particular, when the total combined film thickness of the well layers is not less than 20 nm, the arrangement was proved to be effective in improving the reliability.

EMBODIMENT 2

FIG. 6 is a cross-sectional view of a semiconductor laser device according to the second embodiment of the present invention.

As shown in FIG. 6, a buffer layer 502 made of n-type GaAs having a thickness of 500 nm, a lower clad layer 503 made of n-type AlGaInP having a thickness of 1200 nm, an active layer 504 having a quantum well structure made of GaInP, a lightly doped upper clad layer 505 made of p-type AlGaInP having a thickness of 50 nm, a first heavily doped upper clad layer 506a made of p-type AlGaInP having a thickness of 350 nm, an etching stop layer 507 made of p-type GaInP having a thickness of 6 nm, a second heavily doped upper clad layer 506b made of p-type AlGaInP having a thickness of 600 nm, an intermediate layer 508 made of p-type GaInP having a thickness of 50 nm, and a contact layer 509 made of p-type GaAs having a thickness of 200 nm are formed successively in an ascending order on a substrate 501 made of n-type GaAs. The second heavily doped upper clad layer 506b, the intermediate layer 508, and the contact layer 509 constitute a striped ridge waveguide in the same manner as in the first embodiment and is formed by using the etching selectivity of the etching stop layer 507. A current block layer 510 made of n-type GaAs having a thickness of 400 nm is further formed over the side surfaces of the striped ridge waveguide and the upper surface of the etching stop layer 507. A p-type electrode 511 is formed over the contact layer 509 and the current block layer 510, while an n-type electrode 512 is formed on the back surface of the substrate 501.

Each of the lightly doped upper clad layer 505 and heavily doped upper clad layers 506 composed of the first and second heavily doped upper clad layers 506a and 506b has a lattice mismatch of not less than $2.0 \times 10^{-4}$ and not more than $3.0 \times 10^{-3}$ set with respect to the substrate 501. The etching stop layer 507 is lattice-matched to the substrate 501. The impurity concentrations of the lower clad layer 503, the lightly doped upper clad layer 505, and the heavily doped upper clad layers 506 are adjusted to values in the respective ranges of about $3 \times 10^{17}$ cm$^{-3}$ to $1.5 \times 10^{18}$ cm$^{-3}$, about $1 \times 10^{17}$ cm$^{-3}$ to $3 \times 10^{17}$ cm$^{-3}$, and about $4 \times 10^{17}$ cm$^{-3}$ to $1.5 \times 10^{18}$ cm$^{-3}$.

Although the present embodiment has described the case where the conductivity type of each of the lightly doped upper clad layer 505 and the heavily doped upper clad layers 506 is limited to the p-type, the conductivity type of each of the lightly doped upper clad layer 505 and the heavily doped upper clad layers 506 may also be limited to the n-type. It is also possible to adopt a structure in which not only the lightly doped upper clad layer 505 and the heavily doped upper clad layers 506 but also the lower clad layer 503 has a lattice mismatch. When each of the lightly doped upper clad layer 505, the heavily doped upper clad layers 506, and the lower clad layer 503 has a lattice mismatch, the lattice mismatch may either be substantially uniform or vary within the layer.

The etching stop layer 507 may also be undoped.

In the semiconductor laser device according to the present embodiment thus constructed, each of the lightly doped upper clad layer 505 and the heavily doped upper clad layers 506 has a lattice mismatch of not less than $2.0 \times 10^{-4}$ and not more than $3.0 \times 10^{-3}$ set with respect to the substrate 501 and, in addition, the lightly doped upper clad layer 505 and the heavily doped upper clad layers 506 have an impurity concentration difference therebetween. As a result, the same effects as obtained in the first embodiment are obtainable without forming a semiconductor layer having a negative lattice mismatch in the upper clad layers (505 and 506). However, it is also possible to obtain the same effects as obtained in the first embodiment even when the semiconductor layer having the negative lattice mismatch is formed in the upper clad layers (505 and 506).

Although the specific description has been given to the first and second embodiments of the present invention, the present invention is not limited to the embodiments described above and various modifications can be made based on the technical idea of the present invention. For example, the values, the device structure, the substrate, the process, the growth method, and the like mentioned in each of the embodiments described above are only exemplary. It is also possible to use values, a device structure, a process, a growth method, and the like which are different from those used in the embodiment. Specifically, although metal organic vapor phase epitaxy has been used in the embodiments described above, it is also possible to use another epitaxial growth method such as, e.g., molecular beam epitaxy. Although each of the foregoing embodiments has described only the case where a red semiconductor laser device is an embodiment of the semiconductor laser device according to the present invention, the present invention is also applicable to a blue semiconductor laser device, a red/infrared dual-wavelength semiconductor laser device, or the like. The present invention is also applicable to an AlGaAs semiconductor light emitting device, a semiconductor light emitting device using a group II-VI compound semiconductor, a light emitting device using a nitride group III-V compound semiconductor, or the like.

The semiconductor laser device and the fabrication therefor according to the present invention allow an improvement in the reliability of the device. In addition, because the semiconductor laser device has a structure easy to fabricate, the industrial applicability thereof is high in terms of allowing an improvement in the production yield of the device. In particular, the semiconductor laser device and the fabrication method therefor according to the present invention are highly usable to a laser of which high reliability is required in high-temperature condition, such as in an on-vehicle application.

What is claimed is:

1. A semiconductor laser device, which has a self-sustained pulsation characteristic, comprising:

a lower clad layer formed on a semiconductor substrate;
an active layer formed on the lower clad layer;
a first upper clad layer formed on the active layer;
a semiconductor layer formed on the first upper clad layer; and
a second upper clad layer formed on the semiconductor layer, wherein:
the lower clad layer, the first upper clad layer and the second upper clad layer each made of AlGaInP have a positive lattice mismatch, which is in a range of $2.0 \times 10^{-4}$ to $3.0 \times 10^{-3}$, inclusive, with respect to the semiconductor substrate,
the semiconductor layer has a negative lattice mismatch, which is in a range of $-2.0 \times 10^{-3}$ to $-2.0 \times 10^{-4}$, inclusive, with respect to the semiconductor substrate,
impurity concentrations of the first and second upper clad layers are not less than $3 \times 10^{17}$ cm$^{-3}$,
a well layer composing the active layer has the compressive distortion with respect to the semiconductor substrate and a film thickness of not less than 20 nm, and
the semiconductor layer is made of $Ga_xIn_yP$ (x>y) and functions as an etching stop layer when a ridge portion is formed in the second upper clad layer by etching.

* * * * *